US012666973B2

(12) United States Patent
Yamamoto et al.

(10) Patent No.: US 12,666,973 B2
(45) Date of Patent: Jun. 23, 2026

(54) SEMICONDUCTOR DEVICE, METHOD OF MANUFACTURING SEMICONDUCTOR DEVICE, AND METHOD OF DISPOSING ALIGNMENT MARK

(71) Applicant: Kioxia Corporation, Tokyo (JP)

(72) Inventors: Susumu Yamamoto, Yokkaichi (JP);
Hideki Matsushige, Yokkaichi (JP);
Gen Toyota, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 398 days.

(21) Appl. No.: 18/446,236

(22) Filed: Aug. 8, 2023

(65) Prior Publication Data

US 2024/0055363 A1     Feb. 15, 2024

(30) Foreign Application Priority Data

Aug. 10, 2022     (JP) ................................. 2022-128507

(51) Int. Cl.
*H01L 23/48*          (2006.01)
*H01L 23/52*          (2006.01)
(Continued)

(52) U.S. Cl.
CPC ........... *H10W 46/00* (2026.01); *H10W 20/20* (2026.01); *H10W 46/301* (2026.01);
(Continued)

(58) Field of Classification Search
CPC ... H10W 46/00; H10W 20/20; H10W 72/967; H10W 46/301; H10W 72/926; H10W 90/792; H10W 80/163; H10W 90/00;

H10W 72/90; H10W 72/923; H10W 72/952; H10W 80/327; H10W 80/312; H10W 72/29; H10W 90/26; H10W 70/099; H10W 70/6523; H10W 72/07323; H10W 72/941; H10W 74/141; H10W 72/963; H10W 74/111; H10W 72/072; H10W 72/985; H10W 72/951; H10W 90/754;

(Continued)

(56) References Cited

U.S. PATENT DOCUMENTS 7,998,827 B2 *   8/2011   Hatano ................. H10W 46/00
                                                           438/401
8,692,393 B2     4/2014   Tsai
(Continued)

FOREIGN PATENT DOCUMENTS

JP          2021-136320 A        9/2021

*Primary Examiner* — Niki H Nguyen
(74) *Attorney, Agent, or Firm* — Foley & Lardner LLP

(57)          ABSTRACT

There is provided a semiconductor device including a first chip and a second chip bonded to the first chip. The first chip includes a first alignment mark provided in a first region of a bonding surface and a plurality of first dummy pads provided in a second region of the bonding surface different from the first region. The second chip includes a second alignment mark provided on the bonding surface corresponding to the first alignment mark and a plurality of second dummy pads provided in a region of the bonding surface different from the second alignment mark. A coverage of the first alignment mark in the first region is substantially the same as the coverage of the first dummy pads in the second region.

20 Claims, 13 Drawing Sheets

(51) Int. Cl.

| | |
|---|---|
| *H01L 29/40* | (2006.01) |
| *H10W 20/20* | (2026.01) |
| *H10W 46/00* | (2026.01) |
| *H10W 72/90* | (2026.01) |
| *H10W 80/00* | (2026.01) |
| *H10W 90/00* | (2026.01) |

(52) U.S. Cl.
    CPC ........ *H10W 72/926* (2026.01); *H10W 72/967* (2026.01); *H10W 80/163* (2026.01); *H10W 90/792* (2026.01)

(58) Field of Classification Search
    CPC . H10W 72/012; H10W 72/944; H10W 72/59; H10W 80/301; H10W 72/07523; H10W 72/00; H10W 72/30; H10W 72/325; H10W 72/351; H10W 72/352; H10W 72/353; H10W 72/877; H10W 72/922; H10W 90/20
    See application file for complete search history.

(56) References Cited

U.S. PATENT DOCUMENTS

| | | | | |
|---|---|---|---|---|
| 10,157,867 | B1 * | 12/2018 | Chen | H10W 20/40 |
| 10,504,852 | B1 * | 12/2019 | Chen | H10W 46/00 |
| 11,569,139 | B2 * | 1/2023 | Yokomizo | H10P 74/277 |
| 11,621,202 | B2 * | 4/2023 | Li | H10P 74/277 |
| | | | | 257/48 |
| 11,749,662 | B2 * | 9/2023 | Park | H10W 74/121 |
| | | | | 257/777 |
| 11,776,916 | B2 * | 10/2023 | Park | H10W 46/00 |
| | | | | 257/777 |
| 12,489,071 | B2 * | 12/2025 | Kim | H10W 46/00 |
| 2004/0137702 | A1 * | 7/2004 | Lijima | H10P 54/00 |
| | | | | 257/E23.179 |
| 2009/0023266 | A1 * | 1/2009 | Hatano | H10W 46/00 |
| | | | | 257/E21.54 |
| 2009/0206411 | A1 * | 8/2009 | Koketsu | H10W 46/00 |
| | | | | 257/E21.048 |
| 2011/0186844 | A1 * | 8/2011 | Koo | H10H 20/80 |
| | | | | 438/34 |
| 2012/0270379 | A1 * | 10/2012 | Lai | H10D 84/0135 |
| | | | | 257/E21.54 |
| 2015/0108611 | A1 * | 4/2015 | Kumagai | H10W 46/00 |
| | | | | 257/737 |
| 2017/0047296 | A1 * | 2/2017 | Watanabe | H10W 42/121 |
| 2019/0393159 | A1 * | 12/2019 | Chen | H10W 46/00 |
| 2020/0159133 | A1 * | 5/2020 | Yan | H10W 20/435 |
| 2020/0335473 | A1 * | 10/2020 | Zhou | H10W 46/00 |
| 2020/0350258 | A1 * | 11/2020 | Lee | H10D 1/692 |
| 2021/0035805 | A1 * | 2/2021 | Zhao | H10P 74/23 |
| 2021/0242136 | A1 | 8/2021 | Chen et al. | |
| 2021/0265314 | A1 | 8/2021 | Arai | |
| 2022/0037273 | A1 * | 2/2022 | Park | H10W 90/00 |
| 2022/0130802 | A1 * | 4/2022 | Jun | H10W 90/00 |
| 2022/0285234 | A1 * | 9/2022 | Yokomizo | H10P 74/277 |
| 2022/0310554 | A1 * | 9/2022 | Chen | H10P 52/00 |
| 2023/0207532 | A1 * | 6/2023 | Jun | H10W 90/00 |
| | | | | 257/700 |
| 2024/0038728 | A1 * | 2/2024 | Jang | H10W 90/00 |
| 2024/0069448 | A1 * | 2/2024 | Lianto | G03F 7/70633 |

* cited by examiner

SEMICONDUCTOR DEVICE, METHOD OF MANUFACTURING SEMICONDUCTOR DEVICE, AND METHOD OF DISPOSING ALIGNMENT MARK

CROSS-REFERENCE TO RELATED APPLICATION

This application is based upon and claims the benefit of priority from Japanese Patent Application No. 2022-128507, filed Aug. 10, 2022, the entire contents of which are incorporated herein by reference.

FIELD

Embodiments described herein relate generally to a semiconductor device, a method of manufacturing the semiconductor device, and a method of disposing an alignment mark.

BACKGROUND

In a semiconductor package, a plurality of chips may be stacked by joining between chips provided with through silicon via (TSV).

DESCRIPTION OF THE DRAWINGS

FIG. 14 is a diagram illustrating an example of a configuration of an alignment mark and dummy pads according to a modification of the sixth embodiment.

DETAILED DESCRIPTION

Figure 1:
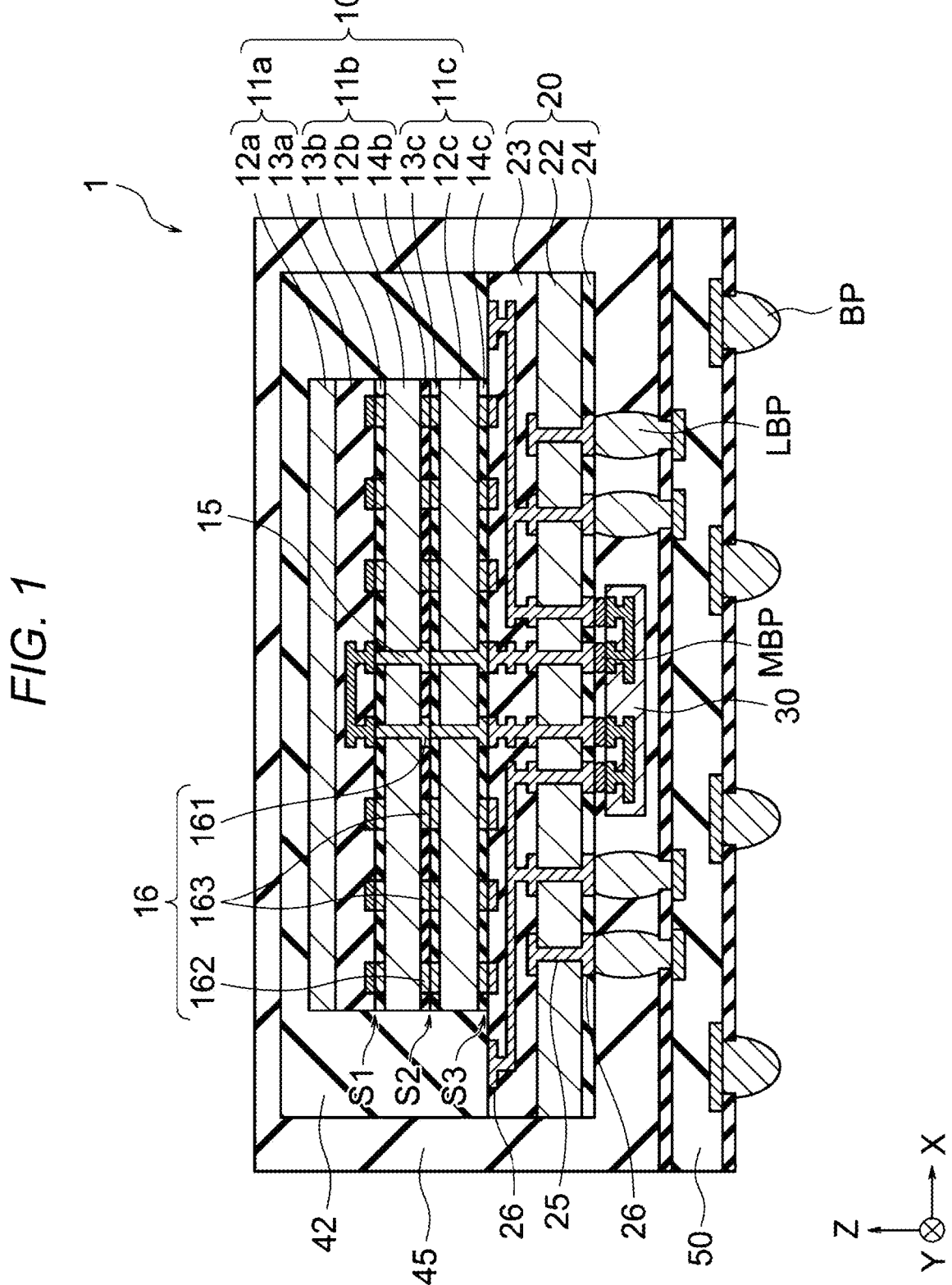
FIG. 1 is a cross-sectional view illustrating an example of a configuration of a semiconductor device according to a first embodiment.

Embodiments provide a semiconductor device capable of more appropriately bonding between chips, a method of manufacturing the semiconductor device, and a method of disposing an alignment mark.

In general, according to at least one embodiment, there is provided a semiconductor device including a first chip and a second chip bonded to the first chip. The first chip includes a first alignment mark provided in a first region of a bonding surface and a plurality of first dummy pads provided in a second region of the bonding surface different from the first region. The second chip includes a second alignment mark provided on the bonding surface corresponding to the first alignment mark and a plurality of second dummy pads provided in a region of the bonding surface different from the second alignment mark. A coverage of the first alignment mark in the first region is substantially the same as the coverage of the first dummy pads in the second region.

Hereinafter, embodiments of the present disclosure will be described with reference to the drawings. The embodiment does not limit the present disclosure. The drawings are schematic or conceptual, and the ratio of respective parts and the like are not necessarily the same as those in reality. In the specification and the drawings, elements that are the same as those described above with respect to the previous drawings are denoted by the same reference numerals, and detailed description thereof will be omitted as appropriate.

First Embodiment

FIG. 1 is a cross-sectional view illustrating an example of a configuration of a semiconductor device 1 according to a first embodiment.

The semiconductor device 1 includes a memory chip stacked body 10, an interposer 20, an interface chip (IF chip) 30, a wiring layer 50, and resins 42 and 45.

FIG. 1 illustrates an X-direction and a Y-direction that are parallel to a front surface of a substrate (wiring layer 50) and perpendicular to each other, and a Z-direction perpendicular to the front surface of the substrate (wiring layer 50). In the specification, the +Z-direction is treated as an upward direction and the −Z-direction is treated as a downward direction. The −Z-direction may or may not coincide with the direction of gravity.

The memory chip stacked body 10 is formed by stacking a plurality of semiconductor chips 11a to 11c. Each of the semiconductor chips 11b and 11c includes a through-electrode (TSV) 15 vertically penetrating through the inside of the semiconductor chip 11b and 11c. In FIG. 1, the semiconductor chip 11a positioned at the top of the memory chip stacked body 10 is not provided with the through-electrode 15, but may be provided with the through-electrode 15. The plurality of semiconductor chips 11a to 11c are connected to each other by the through-electrode 15. A semiconductor element such as a memory cell array is provided in each of the semiconductor chips 11a to 11c. Each of the semiconductor chips 11a to 11c is, for example, a memory chip including a NAND flash memory.

The semiconductor chip 11a includes a substrate 12a and an insulating film 13a. The substrate 12a is a semiconductor substrate. The material of the substrate 12a is, for example, silicon (Si). The insulating film 13a is, for example, an insulating film such as a silicon oxide film. The insulating film 13a is provided on a lower surface of the substrate 12a.

The semiconductor chips 11a and 11b are bonded together by a bonding surface S1.

The semiconductor chip 11b includes a substrate 12b and insulating films 13b and 14b. The substrate 12b is a semiconductor substrate. The material of the substrate 12b is, for example, silicon (Si). The insulating films 13b and 14b are, for example, insulating films such as silicon oxide films. The insulating film 13b is provided on an upper surface of the substrate 12b. The insulating film 14b is provided on a lower surface of the substrate 12b.

The semiconductor chips 11b and 11c are bonded together by a bonding surface S2.

The semiconductor chip 11c includes a substrate 12c and insulating films 13c and 14c. The substrate 12c is a semiconductor substrate. The material of the substrate 12c is, for example, silicon (Si). The insulating films 13c and 14c are, for example, insulating films such as silicon oxide films. The insulating film 13c is provided on an upper surface of the substrate 12c. The insulating film 14c is provided on a lower surface of the substrate 12c.

The semiconductor chip 11c and the interposer 20 are bonded together by a bonding surface S3.

In the example illustrated in FIG. 1, the semiconductor chips 11a to 11c further include a metal pad 16. The metal pad 16 is provided in the insulating films 13a, 13b, 14b, 13c, and 14c to be exposed on the bonding surfaces S1 to S3. The material of the metal pad 16 is, for example, copper (Cu) or aluminum (Al).

The metal pad 16 includes active pads 161, an alignment mark 162, and dummy pads 163.

Each active pad 161 electrically connects the through-electrode (columnar electrode) 15 of adjacent semiconductor chips. The active pads 161 are electrically connected to a semiconductor element in the semiconductor device 1. The active pads 161 are used for transmitting signal and power for operating the semiconductor device 1.

The alignment mark 162 is provided for position alignment when bonding adjacent semiconductor chips.

The alignment mark 162 of the semiconductor chip 11b is provided in a mark region Rm of the bonding surface S2. The alignment mark 162 of the semiconductor chip 11c is provided on the bonding surface S2 corresponding to the alignment mark 162 of the semiconductor chip lib.

The dummy pads 163 are metal pads that do not contribute to the operation of the semiconductor device 1. The dummy pads 163 are located to adjust the density of the metal pad 16 on the bonding surface. The dummy pads 163 are provided, for example, to prevent overpolishing and dishing of the metal pad 16 during chemical mechanical polishing (CMP).

A plurality of dummy pads 163 of the semiconductor chip 11b are provided in a dummy region Rd of the bonding surface S2 different from the mark region Rm. A plurality of dummy pads 163 of the semiconductor chip 11c are provided in a region of the bonding surface S2 different from the alignment mark 162 of the semiconductor chip 11c.

The semiconductor chips are not limited to being stacked in three stages, and may be stacked in two stages or four or more stages. Details of a configuration of the semiconductor chips 11a, 11b, and 11c will be described later with reference to FIG. 2B.

The interposer 20 is provided below the memory chip stacked body 10 and bonded to the lowermost semiconductor chip 11c. The interposer 20 includes a substrate 22 and insulating films 23 and 24. The material of the substrate 22 is, for example, silicon (Si). The insulating films 23 and 24 are, for example, insulating films such as silicon oxide films. Here, the interposer 20 is a silicon interposer. The interposer 20 further includes a through-electrode 25 and metal pads 26. The metal pads 26 are provided on the upper and lower surfaces of the interposer 20. The through-electrode 25 is electrically connected to the metal pads 26.

Details of a configuration of the interposer 20 will be described later with reference to FIG. 2A.

The IF chip 30 includes an interface circuit (IF circuit) for data communication between the plurality of semiconductor chips 11a to 11c forming the memory chip stacked body 10 and an external device (not illustrated). The IF chip 30 is connected to the interposer 20 via bumps (microbumps) MBPs and the like, which are internal connection terminals. The IF chip 30 is disposed on a surface on the wiring layer 50 side of the interposer 20. However, the IF chip 30 is not limited to the position illustrated in FIG. 1, and may be disposed, for example, between the semiconductor chips 11a to 11c of the memory chip stacked body 10, or the IF circuit may be mounted in the semiconductor chips 11a to 11c without providing the IF chip 30 itself. The width of the IF chip 30 is smaller than the width of the semiconductor chips 11a to 11c (memory chip stacked body 10).

The wiring layer 50 is provided below the interposer 20 and the IF chip 30. The wiring layer 50 is connected to the interposer 20 via bumps (large bumps) LBPs, which are internal connection terminals. Bumps BPs serving as external connection terminals are provided on the surface of the wiring layer 50 opposite to the interposer 20. The bumps BPs are electrically connected to the bumps LBPs via a wiring network (not illustrated) in the wiring layer 50. When the semiconductor device 1 is used as a ball grid array (BGA) package as illustrated in FIG. 1, each bump BP is configured with a protruding terminal having a solder ball, solder plating, Au plating, or the like. However, the semiconductor device 1 of the embodiment can also be applied to other semiconductor packages such as land grid array (LGA) type and chip size package (CSP) type in which metal lands are provided as the bumps BPs.

The wiring layer 50 is, for example, provided with a wiring network (not illustrated) on a front surface and inside of an insulating resin substrate or an insulating resin layer. As the wiring layer 50, specifically, a printed wiring board (multilayer printed substrate or the like) using insulating resin such as glass-epoxy resin or bismaleimide-triazine resin (BT resin) is used. The wiring layer 50 also includes an interposer, a wiring substrate, a package substrate, or a rewiring layer formed directly on a chip or an interposer.

A resin 42 covers the memory chip stacked body 10. A resin 45 covers the resin 42 and the interposer 20, and is provided between the interposer 20 and the wiring layer 50.

The resins 42 and 45 are, for example, thermosetting resin. As the thermosetting resin, for example, a mixture of epoxy-based resin, acrylic-based resin, amine-based resin, silicone-based resin, polyimide-based resin, or the like and a filler such as silica is used. For the resin 42 and the resin 45, materials having different components are used, for example. The resin 42 is, for example, epoxy-based resin, and is desirably a material having small filler particles or a liquid material that easily permeates. The resin 45 is, for example, epoxy-based resin, and is desirably a material having large filler particles and a coefficient of thermal expansion close to that of the material of the memory chip stacked body 10, the interposer 20, and the IF chip 30. As described above, even if the resin 42 and the resin 45 are the same epoxy-based resin, it is desirable that the resin 42 and the resin 45 have different components. However, the resin 42 and the resin 45 may be the same material having the same component.

Next, details of the interposer 20 and the semiconductor chips 11a, 11b, and 11c will be described.

Figure 2A:
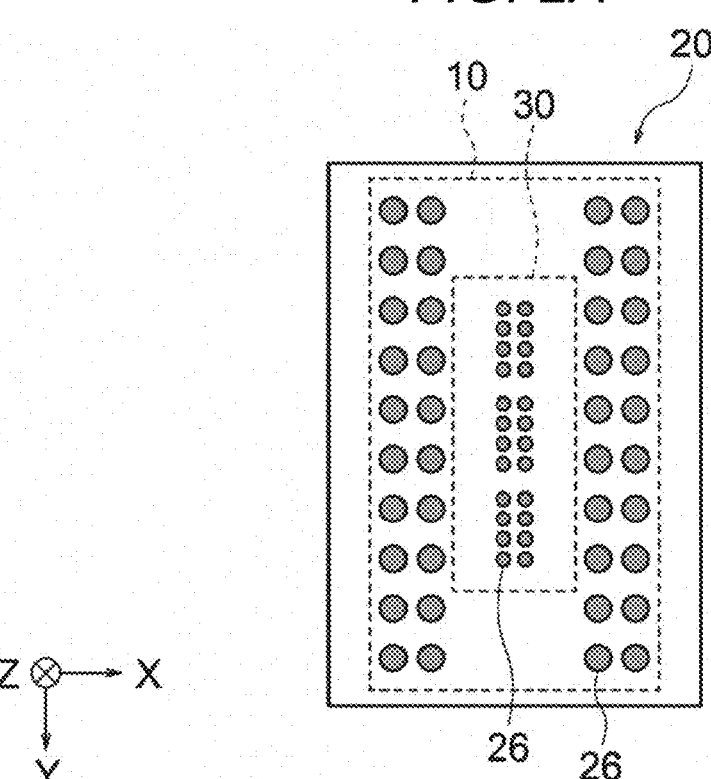
FIG. 2A is a diagram illustrating an example of a configuration of an interposer according to the first embodiment.

FIG. 2A is a diagram illustrating an example of the configuration of the interposer 20 according to the first embodiment. FIG. 2A is a diagram of the interposer 20 illustrated in FIG. 1 viewed from below the paper surface. The number and arrangement of the metal pads 26 and the like are not limited to the example illustrated in FIG. 2A.

At the central portion of the interposer 20, the metal pads 26 connected to the bumps MBPs are provided. Some of the metal pads 26 at the central portion of the interposer 20 are connected to the semiconductor chips 11a, 11b, and 11c via the through-electrodes 25. The metal pads 26 connected to the bumps LBPs are provided around the metal pads 26 connected to the bumps MBPs.

Figure 2B:
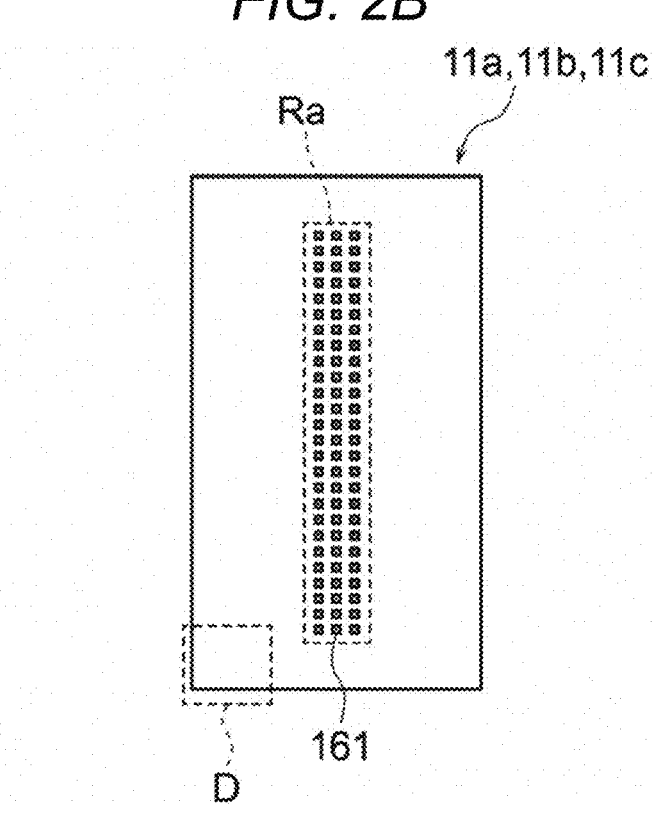
FIG. 2B is a diagram illustrating an example of a configuration of a semiconductor chip according to the first embodiment.
Figure 2B:
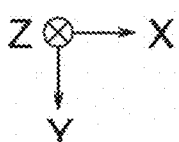

FIG. 2B is a diagram illustrating an example of the configuration of the semiconductor chips 11a, 11b, and 11c according to the first embodiment. FIG. 2B is a view of the semiconductor chips 11a, 11b, and 11c illustrated in FIG. 1 viewed from below the paper surface. In FIG. 2B, the active pads 161 are illustrated, but the alignment mark 162 and the dummy pads 163 are omitted. The number and arrangement of the active pads 161 and the like are not limited to the example illustrated in FIG. 2B.

The active pads 161 are provided at the central portion of each of the semiconductor chips 11a, 11b, and 11c. Each of the central portions of the semiconductor chips 11a, 11b, and 11c is an active region Ra.

The mark region Rm and the dummy region Rd are located around the active region Ra. The alignment mark 162 is provided in the mark region Rm. The dummy pads 163 are provided in the dummy region Rd.

Next, details of the alignment mark 162 in the mark region Rm and the dummy pads 163 in the dummy region Rd will be described.

Figure 3:
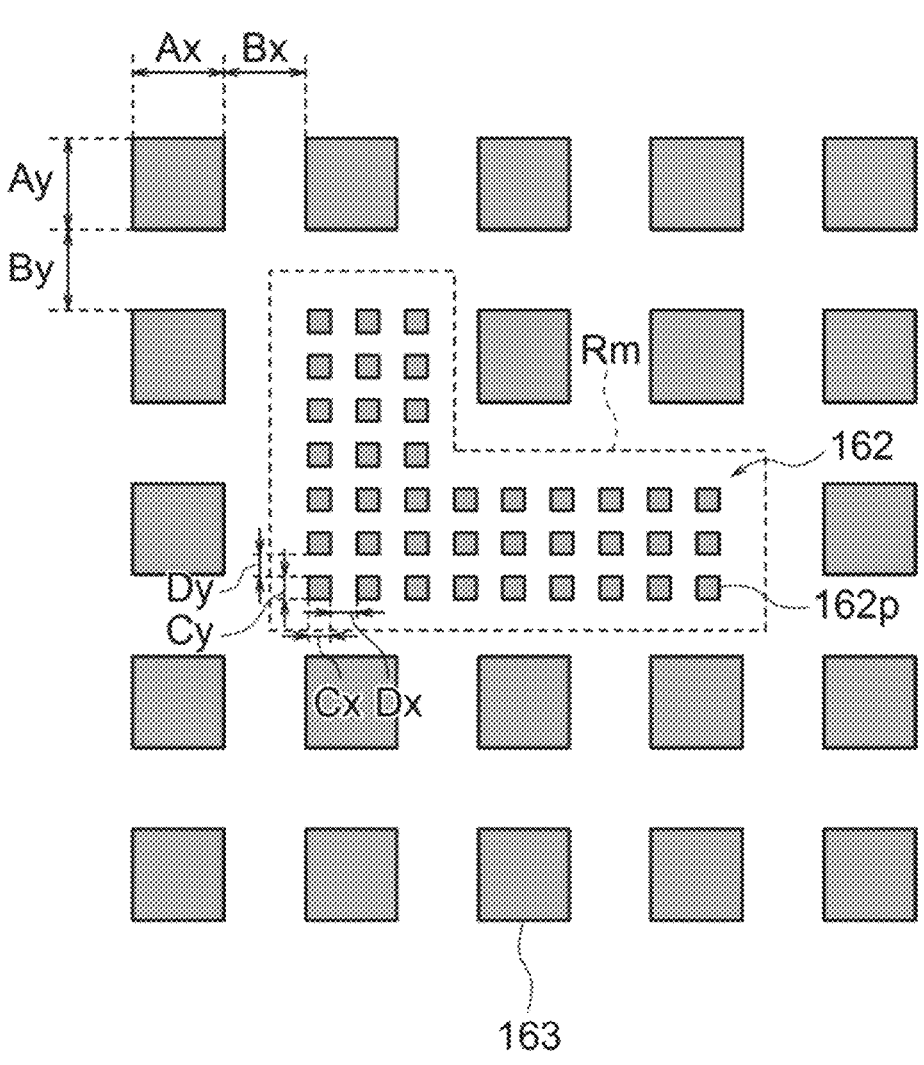
FIG. 3 is a diagram illustrating an example of a configuration of an alignment mark and dummy pads according to the first embodiment.
Figure 3:
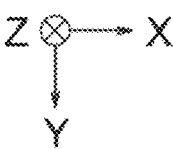

FIG. 3 is a diagram illustrating an example of a configuration of the alignment mark 162 and the dummy pads 163 according to the first embodiment. FIG. 3 is an enlarged view of a broken-line frame D of each of corners of the semiconductor chips 11a, 11b, and 11c in FIG. 2B.

In FIG. 3, the dummy pads 163 are provided in the dummy region Rd, which is a region other than the mark region Rm. Each dummy pad 163 has, for example, a substantially square shape. The dummy pads 163 are located in a lattice shape, for example.

An X-direction size Ax of each dummy pad 163 is, for example, approximately 5 μm. A Y-direction size Ay of each dummy pad 163 is, for example, approximately 5 μm. An X-direction pitch Bx between the dummy pads 163 is, for example, approximately 5 μm. A Y-direction pitch By between the dummy pads 163 is, for example, approximately 5 μm.

The pitch Bx indicates a distance between opposing end portions of two adjacent dummy pads 163 along the X-direction. The pitch By indicates a distance between the opposing end portions of two adjacent dummy pads 163 along the Y-direction.

A coverage CV1 of the dummy pads 163 in the dummy region Rd is represented by Equation 1 using the sizes Ax and Ay and the pitches Bx and By.

$$CV1=(Ax \times Ay) \pm \{(Ax+Bx) \times (Ay+By)\} \times 100 \qquad \text{(Equation 1)}$$

The coverage CV1 is calculated using the above sizes Ax and Ay and pitches Bx and By, and is, for example, approximately 25%.

The alignment mark 162 is provided in the mark region Rm. The alignment mark 162 includes a plurality of alignment pads 162p. Each alignment pad 162p has, for example, a substantially square shape. The alignment pads 162p are located, for example, in a lattice shape.

An X-direction size Cx of each alignment pad 162p is, for example, approximately 2.5 μm. A Y-direction size Cy of each alignment pad 162p is, for example, approximately 2.5 μm. An X-direction pitch Dx between the alignment pads 162p is, for example, approximately 2.5 μm. A Y-direction pitch Dy between the alignment pads 162p is, for example, approximately 2.5 μm.

The pitch Dx indicates a distance between opposing end portions of two adjacent alignment pads 162p along the X-direction. The pitch Dy indicates a distance between the opposing end portions of two adjacent alignment pads 162p along the Y-direction.

A coverage CV2 of the alignment pads 162p (alignment mark 162) in the mark region Rm is represented by Equation 2 using the sizes Cx and Cy and the pitches Dx and Dy.

$$CV2=(Cx \times Cy) \pm \{(Cx+Dx) \times (Cy+Dy)\} \times 100 \qquad \text{(Equation 2)}$$

The coverage CV2 is calculated using the above sizes Cx and Cy and pitches Dx and Dy, and is, for example, approximately 25%.

The coverage CV2 of the alignment mark 162 in the mark region Rm is substantially the same as the coverage CV1 of the dummy pads 163 in the dummy region Rd. "Substantially the same" with respect to the coverage does not necessarily have to be the same, and a certain amount of difference is allowed. For example, the difference between the coverage CV2 of the alignment mark 162 and the coverage CV1 of the first dummy pads is preferably as small as possible. Therefore, overpolishing, dishing, and the like when forming the metal pad 16 by CMP can be prevented. As a result, the chips can be bonded together more appropriately.

One of each alignment pad 162p and each dummy pad 163 is larger in size and larger in pitch than the other. Therefore, a boundary between the mark region Rm and the dummy region Rd can be easily recognized, and the alignment mark 162 can be easily recognized. In the example illustrated in FIG. 3, the size of each alignment pad 162p is smaller than the size of each dummy pad 163. The pitch between the alignment pads 162p is smaller than the pitch between the dummy pads 163.

Next, a method of disposing the alignment mark 162 and the dummy pads 163 will be described.

Figure 4A:
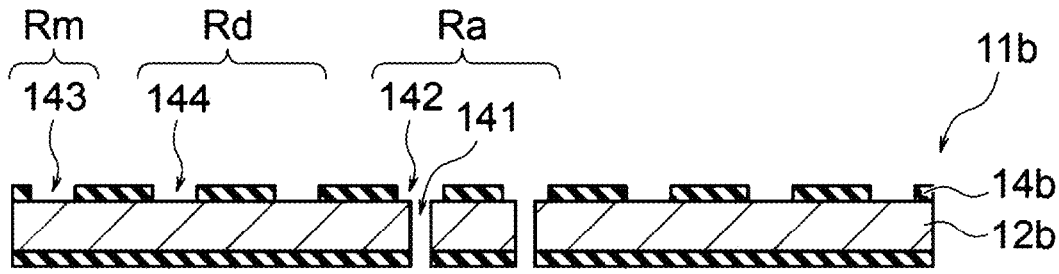
FIG. 4A is a cross-sectional view illustrating an example of a method of disposing the alignment mark according to the first embodiment.
Figure 4B:
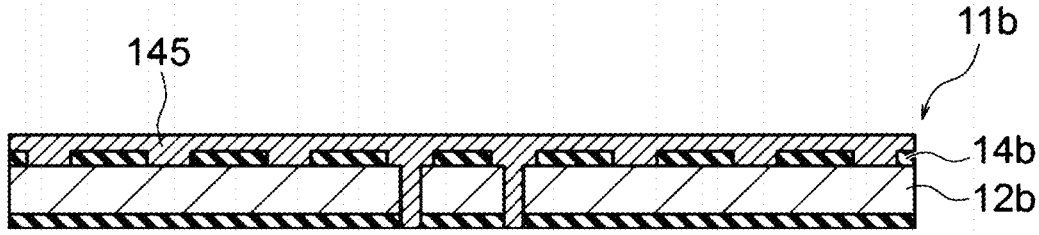
FIG. 4B is a cross-sectional view illustrating an example of the method of disposing the alignment mark following FIG. 4A.
Figure 4C:
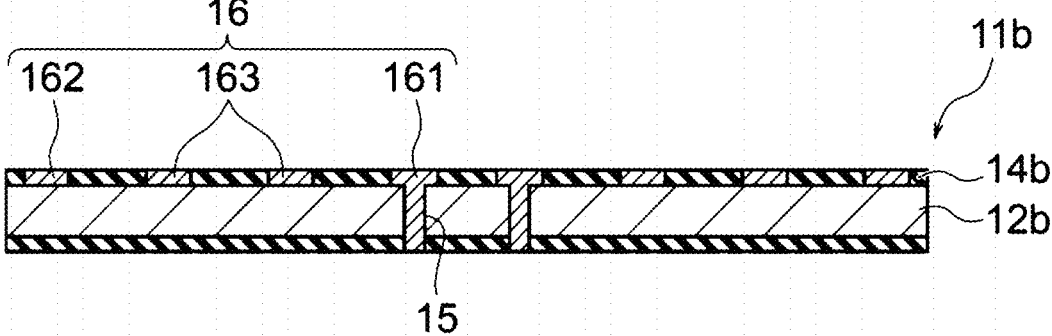
FIG. 4C is a cross-sectional view illustrating an example of the method of disposing the alignment mark following FIG. 4B.

FIGS. 4A to 4C are cross-sectional views illustrating an example of the method of disposing the alignment mark 162 according to the first embodiment. FIGS. 4A to 4C illustrate examples of forming the alignment mark 162 and the dummy pads 163 on the insulating film 14b of the semiconductor chip 11b.

First, as illustrated in FIG. 4A, a recess portion 143 is formed in a first region of the insulating film 14b of the semiconductor chip 11b, and a recess portion 144 is formed in a second region of the insulating film 14b. The first region is a region corresponding to the mark region Rm. The second region is a region corresponding to the dummy region Rd. In the example illustrated in FIG. 4A, a through-hole 141 and a recess portion 142 are also formed in a region corresponding to the active region Ra.

Next, as illustrated in FIG. 4B, a conductor 145 is formed on the insulating film 14b and inside the through-hole 141 and the recess portions 142 to 144. The conductor 145 includes, for example, copper (Cu) or aluminum (Al).

Next, as illustrated in FIG. 4C, the conductor 145 is polished until the insulating film 14b is exposed. Polishing of the conductor 145 is performed by, for example, CMP. Therefore, the alignment mark 162 provided in the mark region Rm and the dummy pads 163 provided in the dummy region Rd are formed. In the example illustrated in FIG. 4C, the through-electrode 15 and the active pads 161 are also formed.

Next, a method of manufacturing the semiconductor device 1 will be described.

Figures 5, 6:
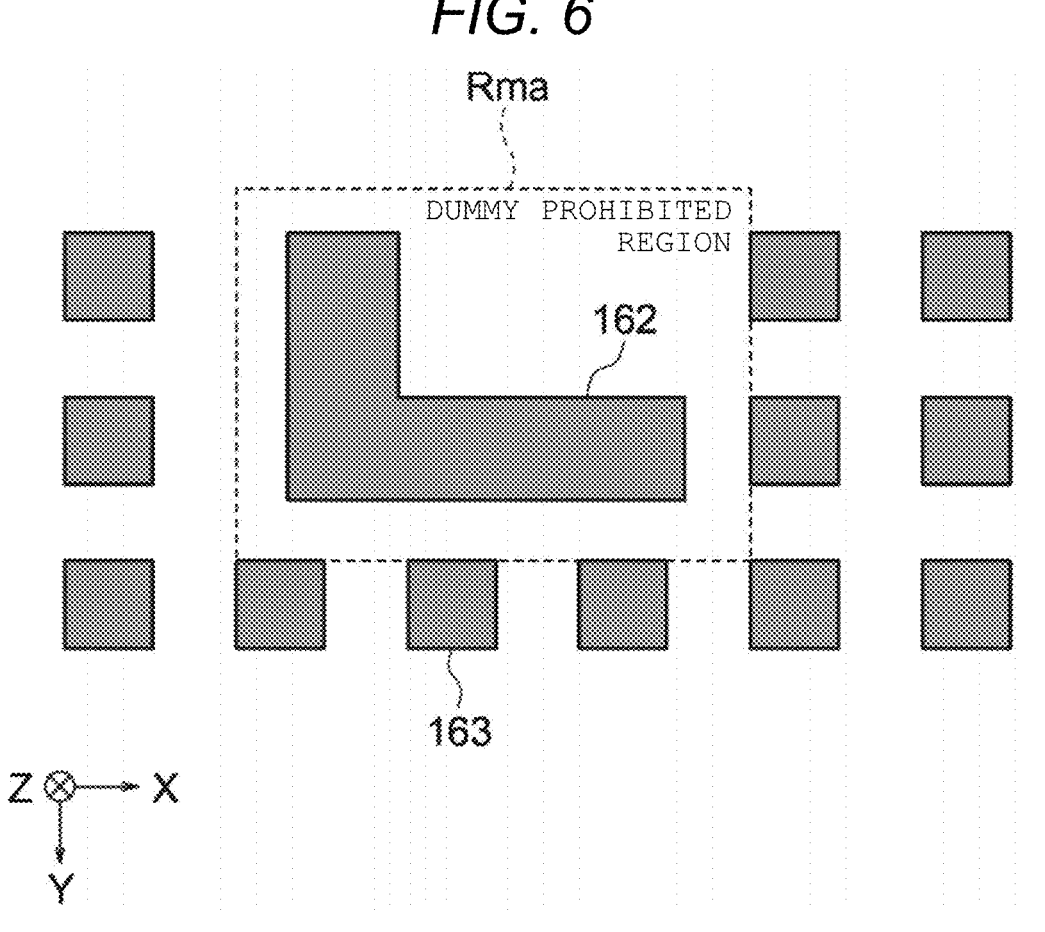
FIG. 5 is a diagram illustrating an example of a method of manufacturing the semiconductor device according to the first embodiment.
FIG. 6 is a diagram illustrating an example of a configuration of an alignment mark and dummy pads according to a comparative example.

FIG. 5 is a diagram illustrating an example of a method of manufacturing the semiconductor device 1 according to the first embodiment.

The alignment mark 162 and the dummy pads 163 are formed on a first surface of the semiconductor chip 11b by the same process as in FIGS. 4A to 4C. Similarly, the alignment mark 162 and the dummy pads 163 are also formed on a second surface of the semiconductor chip 11c.

Based on the alignment mark 162 of the semiconductor chip 11b and the alignment mark 162 of the semiconductor chip 11c, the first surface of the semiconductor chip 11c and the second surface of the semiconductor chip 11b are bonded together.

In the example illustrated in FIG. 5, for example, position alignment of two semiconductor chips 11b and 11c are performed using image recognition. A camera of a position alignment device is inserted, for example, between the semiconductor chips 11b and 11c to capture images of respective surfaces of the semiconductor chips 11b and 11c. The alignment marks 162 are recognized from the captured image. Image recognition may be performed using, for example, artificial intelligence (AI) technology such as machine learning. The position alignment is performed based on the recognized alignment marks 162.

Thereafter, the semiconductor chips 11b and 11c are bonded by performing bonding annealing. Therefore, the alignment mark 162 of the semiconductor chip 11b and the alignment mark 162 of the semiconductor chip 11c are joined, and the dummy pads 163 of the semiconductor chip 11b and the dummy pads 163 of the semiconductor chip 11c are joined.

As described above, according to the first embodiment, the coverage of the alignment mark 162 in the mark region Rm is substantially the same as the coverage of the dummy pads 163 in the dummy region Rd. Therefore, dishing can be prevented in CMP. As a result, the chips can be joined together more appropriately.

Bumps or the like are not provided between the through-electrodes 15 of adjacent semiconductor chips. The semiconductor chips are bonded by joining the metal pads 16 (wirings) exposed on the front surfaces of the semiconductor chips. Therefore, the memory chip stacked body 10 can be made thinner.

The alignment mark 162 illustrated in FIG. 3 is an L-shape. The alignment mark 162 is preferably asymmetric with respect to an axis parallel to the bonding surface S2. Therefore, upper, lower, right and left sides thereof can be distinguished.

COMPARATIVE EXAMPLE

FIG. 6 is a diagram illustrating an example of a configuration of an alignment mark 162 and dummy pads 163 according to a comparative example. The comparative example is different from the first embodiment in that a dummy prohibited region is provided near the alignment mark 162.

Recognition of the alignment mark 162 is performed, for example, by image recognition after capturing (optically measuring) images of the alignment mark 162, as described with reference to FIG. 5. In some cases, to improve the recognition accuracy of the alignment mark 162, a dummy prohibited region Rma with no dummy pads 163 may be provided around the alignment mark 162. However, since the coverage of the alignment mark 162 in the dummy prohibited region Rma is low, there is a possibility that influence of dishing of the alignment mark 162 may become large in CMP. When influence of dishing is large, even if the alignment mark 162 expands due to heat treatment, there is a possibility that a gap may occur without properly joining with the opposing alignment mark 162.

In contrast, in the first embodiment, the dummy prohibited region Rma is not provided. For example, a distance between the alignment mark 162 and the dummy pads 163 around the alignment mark 162 is approximately the same as the distance between the dummy pads 163. That is, the dummy pads 163 are provided up to the vicinity of the alignment mark 162, and the coverage of the alignment mark 162 and the dummy region Rd around the alignment mark 162 becomes more uniform. Therefore, dishing of the alignment mark 162 can be prevented. As a result, the chips can be bonded together more appropriately.

In the first embodiment, a plurality of alignment pads 162p in the mark region Rm have contrast different from that of a plurality of dummy pads in the dummy region Rd. Even if the dummy prohibited region Rma is not provided, due to the difference in contrast (texture) between the mark region Rm and the dummy region Rd, the boundary between the mark region Rm and the dummy region Rd can be easily recognized. As a result, the alignment mark 162 can be easily recognized.

Second Embodiment

Figure 7:
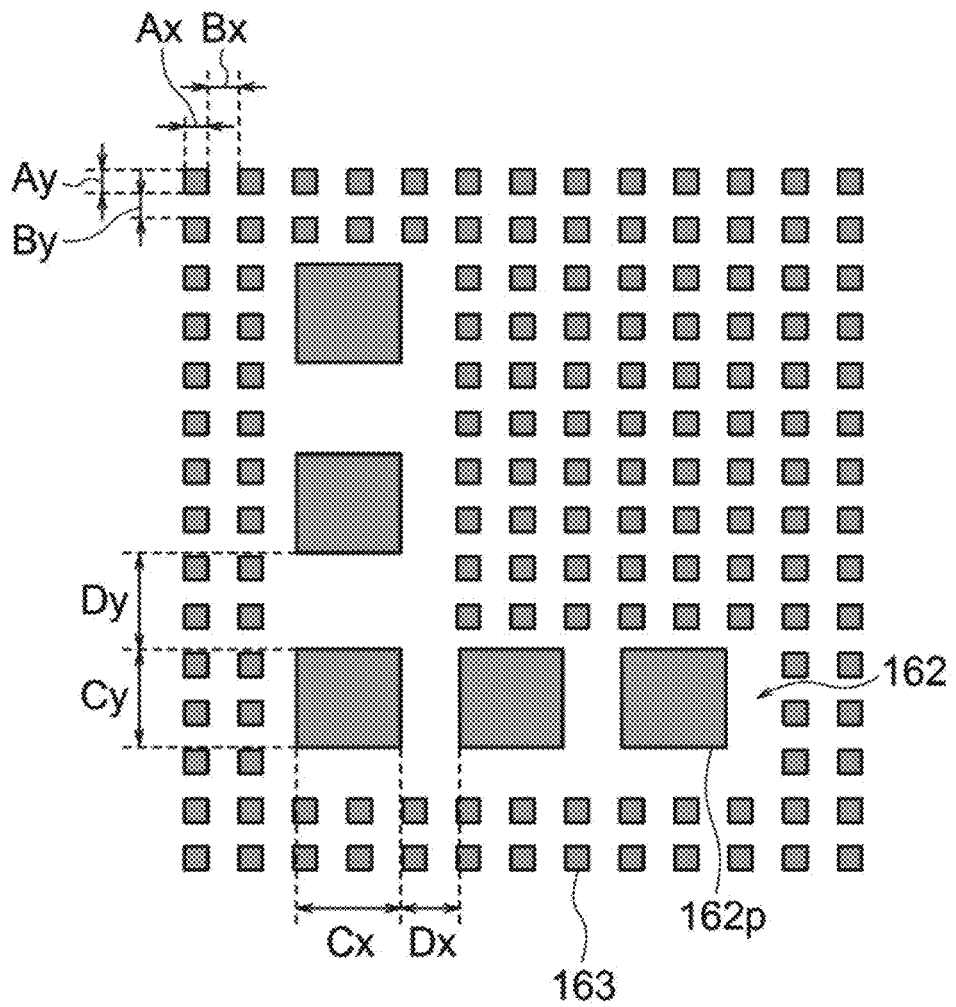
FIG. 7 is a diagram illustrating an example of a configuration of an alignment mark and dummy pads according to a second embodiment.
Figure 7:
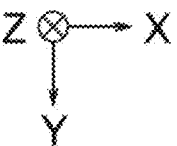

FIG. 7 is a diagram illustrating an example of a configuration of an alignment mark 162 and dummy pads 163 according to a second embodiment. The second embodiment differs from the first embodiment in that the size relationship between each alignment pad 162p and each dummy pad 163 is reversed.

In the example illustrated in FIG. 7, the size of each alignment pad 162p is larger than the size of each dummy pad 163. The pitch between the alignment pads 162p is larger than the pitch between the dummy pads 163.

An X-direction size Ax of each dummy pad 163 is, for example, approximately 2.5 μm. A Y-direction size Ay of each dummy pad 163 is, for example, approximately 2.5 μm. An X-direction pitch Bx between the dummy pads 163 is, for example, approximately 2.5 μm. A Y-direction pitch By between the dummy pads 163 is, for example, approximately 2.5 μm.

A coverage CV1 of the dummy pads 163 in the dummy region Rd is represented by Equation 1 using the sizes Ax and Ay and the pitches Bx and By. The coverage CV1 is calculated using the above sizes Ax and Ay and pitches Bx and By, and is, for example, approximately 25%.

An X-direction size Cx of each alignment pad 162p is, for example, approximately 5 µm. A Y-direction size Cy of each alignment pad 162p is, for example, approximately 5 µm. An X-direction pitch Dx between the alignment pads 162p is, for example, approximately 5 µm. A Y-direction pitch Dy between the alignment pads 162p is, for example, approximately 5 µm.

A coverage CV2 of the alignment pads 162p (alignment mark 162) in the mark region Rm is represented by Equation 2 using the sizes Cx and Cy and the pitches Dx and Dy. The coverage CV2 is calculated using the above sizes Cx and Cy and pitches Dx and Dy, and is, for example, approximately 25%.

Also in the second embodiment, the coverage CV2 of the alignment mark 162 is substantially the same as the coverage CV1 of the dummy pads 163. Therefore, the chips can be bonded together more appropriately. The alignment mark 162 is recognized due to the difference in contrast between the mark region Rm and the dummy region Rd, as described in the first embodiment.

Figure 8:
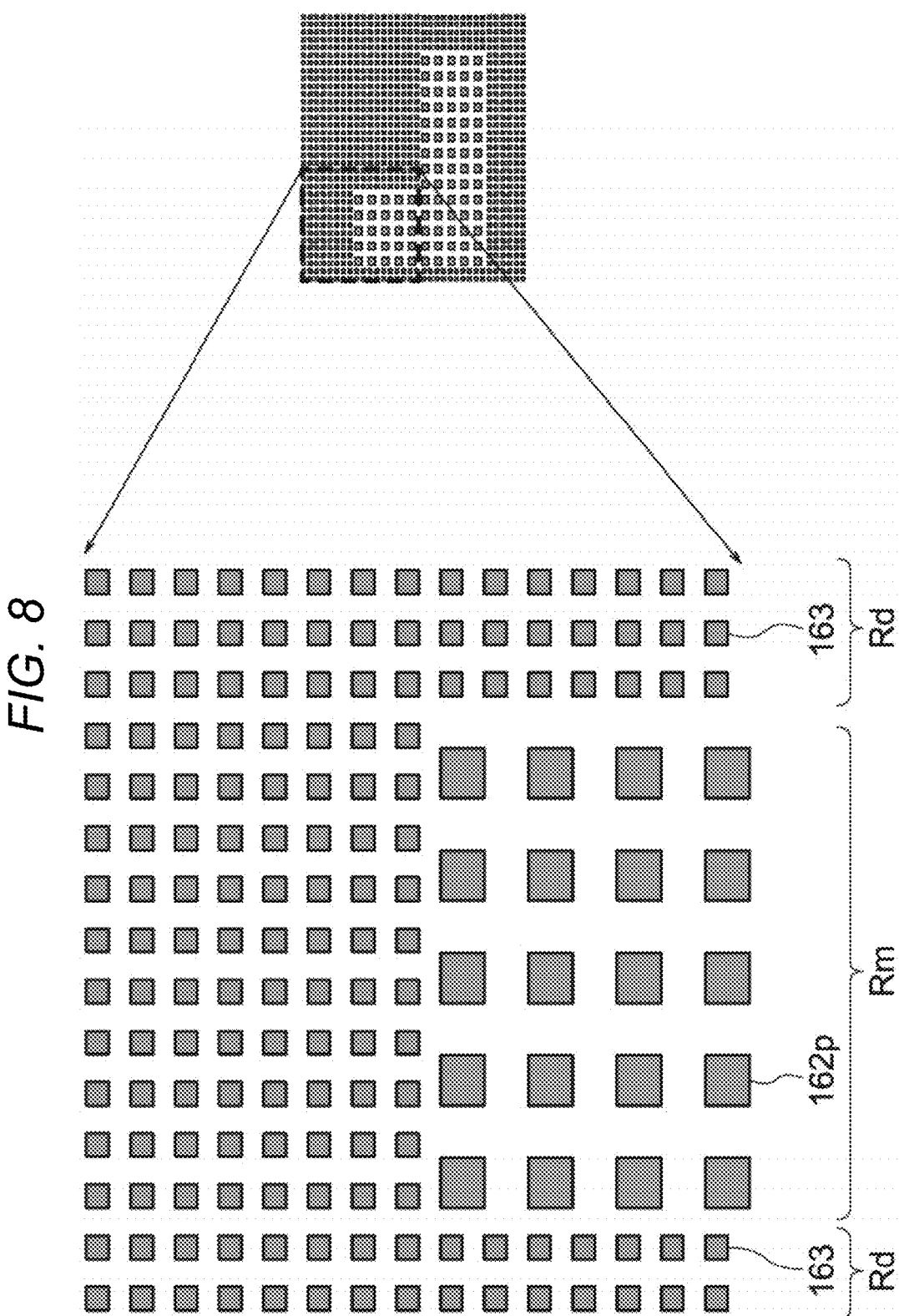
FIG. 8 is a diagram illustrating an example of a mark region and a dummy region according to the second embodiment.

FIG. 8 is a diagram illustrating an example of the mark region Rm and the dummy region Rd according to the second embodiment. The left side of FIG. 8 is an enlarged view of a part of the right side of FIG. 8.

As illustrated in FIG. 8, at the boundary between the mark region Rm and the dummy region Rd, the distance between one alignment pad 162p and one dummy pad 163 is approximately the same as the pitch between the alignment pads 162p or the pitch between the dummy pads 163. As described above, the alignment mark 162 can be recognized due to the difference in contrast.

Figure 9:
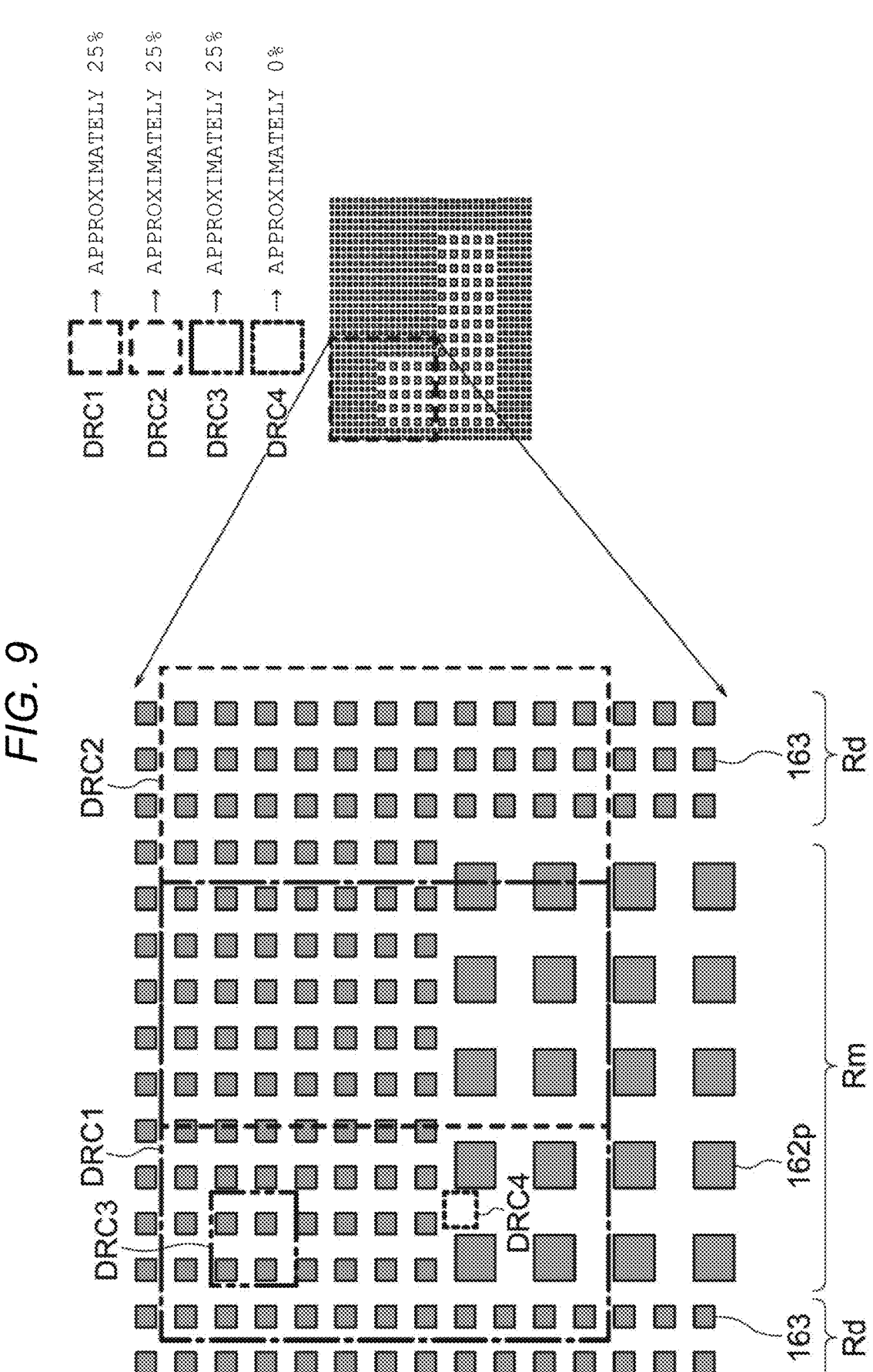
FIG. 9 is a diagram illustrating an example of a coverage calculation range according to the second embodiment.

FIG. 9 is a diagram illustrating an example of a coverage calculation range according to the second embodiment.

In the example illustrated in FIG. 9, four ranges DRC1 to DRC4 are illustrated. The ranges DRC1 to DRC4 are examples of coverage calculation ranges (design rule check boxes) in which the coverage of the metal pad 16 is calculated. The range DRC2 illustrates an example of the coverage calculation range at a position close to the range DRC1 in the X-direction (the left-right direction of the paper surface in FIG. 9). The ranges DRC3 and DRC4 are examples for illustrating the size of the coverage calculation range.

When the size of the coverage calculation range is extremely small, the coverage of the metal pad 16 may become an extremely small value or an extremely large value. The size of range DRC4 illustrated in FIG. 9 is approximately the same as the size of each alignment pad 162p or each dummy pad 163. Since the range DRC4 illustrated in FIG. 9 does not include the alignment pads 162p and the dummy pads 163, the coverage is approximately 0%.

The coverage calculation range preferably has a size that multiplies a predetermined number by the maximum long side of one alignment pad 162p or one dummy pad 163.

A size of one side of the range DRC3 illustrated in FIG. 9 is approximately four times that of one side of each dummy pad 163. The coverage of the dummy pads 163 for the range DRC3 is, for example, approximately 25%. However, even with the size of DRC3, the coverage may not be stable depending on a location where the measurement is made. Therefore, the size of one side of each of the coverage calculation ranges, such as DRC1 and DRC2, which will be described later, is preferably approximately 10 to 20 times the maximum long side of the dummy pads 163, for example.

For each position where the coverage calculation range is moved by a predetermined fraction of one side of the coverage calculation range, the coverage of the alignment mark 162 and the dummy pads 163 with respect to the coverage calculation range is preferably in a range of, for example, approximately 25±20%.

The size of one side of the ranges DRC1 and DRC2 illustrated in FIG. 9 is, for example, approximately twenty times the size of one side of each dummy pad 163 or approximately ten times the size of one side of each alignment pad 162p. Each of the ranges DRC1 and DRC2 includes both the alignment mark 162 and the dummy pads 163. The range DRC2 indicates a range obtained by moving the range DRC1 in the right direction of the paper surface in FIG. 9 by approximately one-half of one side of the range DRC1. That is, a step pitch of the design rule check is approximately one-half of one side of the range DRC1. The alignment pads 162p and the dummy pads 163 are designed so that even when the range DRC1 is moved for each step pitch and the range DRC1 is in any position, the coverage is in a range of approximately 25±20%.

As in the second embodiment, the size relationship between each alignment pad 162p and each dummy pad 163 may be reversed. The semiconductor device 1 according to the second embodiment can obtain the same effect as that of the first embodiment.

Third Embodiment

Figure 10:
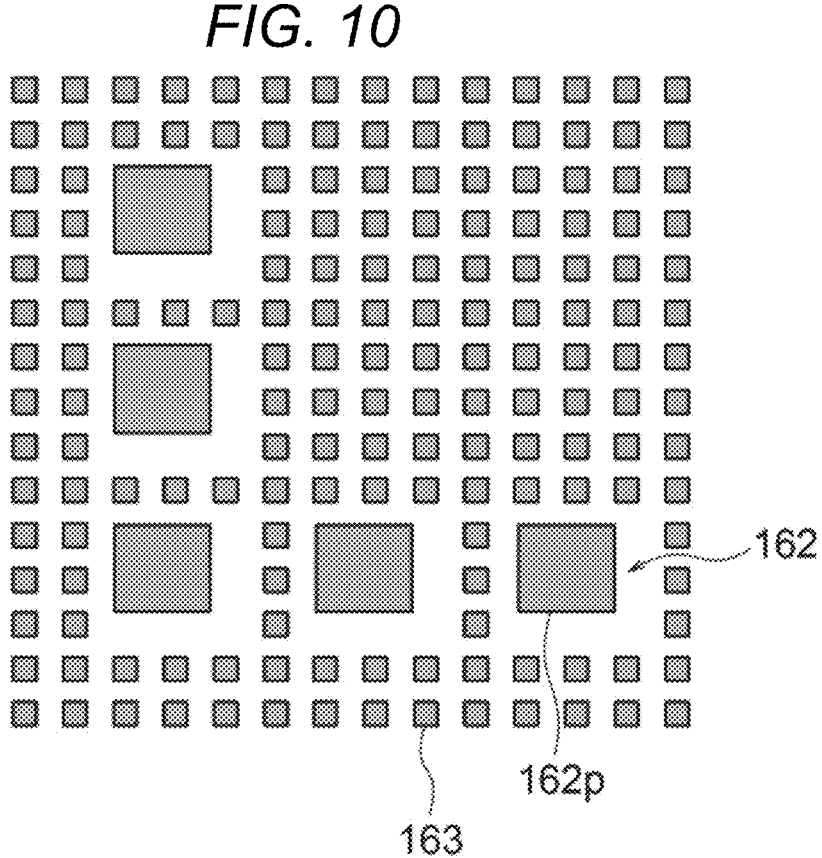
FIG. 10 is a diagram illustrating an example of a configuration of an alignment mark and dummy pads according to a third embodiment.
Figure 10:

FIG. 10 is a diagram illustrating an example of a configuration of an alignment mark 162 and dummy pads 163 according to a third embodiment. The third embodiment differs from the second embodiment in that the dummy pads 163 are further provided between alignment pads 162p.

The dummy pads 163 further fill the gaps between the alignment pads 162p.

As in the third embodiment, the dummy pads 163 may also be provided between the alignment pads 162p. The semiconductor device 1 according to the third embodiment can obtain the same effect as that of the second embodiment.

Fourth Embodiment

Figure 11:
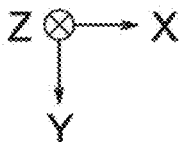
FIG. 11 is a diagram illustrating an example of a configuration of an alignment mark and dummy pads according to a fourth embodiment.

FIG. 11 is a diagram illustrating an example of a configuration of an alignment mark 162 and dummy pads 163 according to a fourth embodiment. In the fourth embodiment, the arrangement of the dummy pads 163 is different from that in the third embodiment.

At least one of alignment pads 162p and the dummy pads 163 are located in a triangular lattice shape. In the example illustrated in FIG. 11, the dummy pads 163 are located in the triangular lattice shape.

The dummy pads 163 along the Y-direction are alternately staggered in the X-direction by approximately one-half of the pitch between the dummy pads 163. Therefore, the boundary between the mark region Rm and the dummy region Rd can be easily recognized. The distance between the dummy pads 163 in the XY plane can be made more uniform.

As in the fourth embodiment, the arrangement of the dummy pads 163 may be changed. The semiconductor device 1 according to the fourth embodiment can obtain the same effect as that of the third embodiment.

In the example illustrated in FIG. 11, the dummy pads 163 are located between the alignment pads 162p. However, the dummy pads 163 may not be located between the alignment pads 162p as illustrated in FIG. 7. As illustrated in FIG. 3, when the size of each alignment pad 162p is smaller than that of each dummy pad 163, the alignment pads 162p may be located in a triangular lattice shape.

Fifth Embodiment

Figure 12:
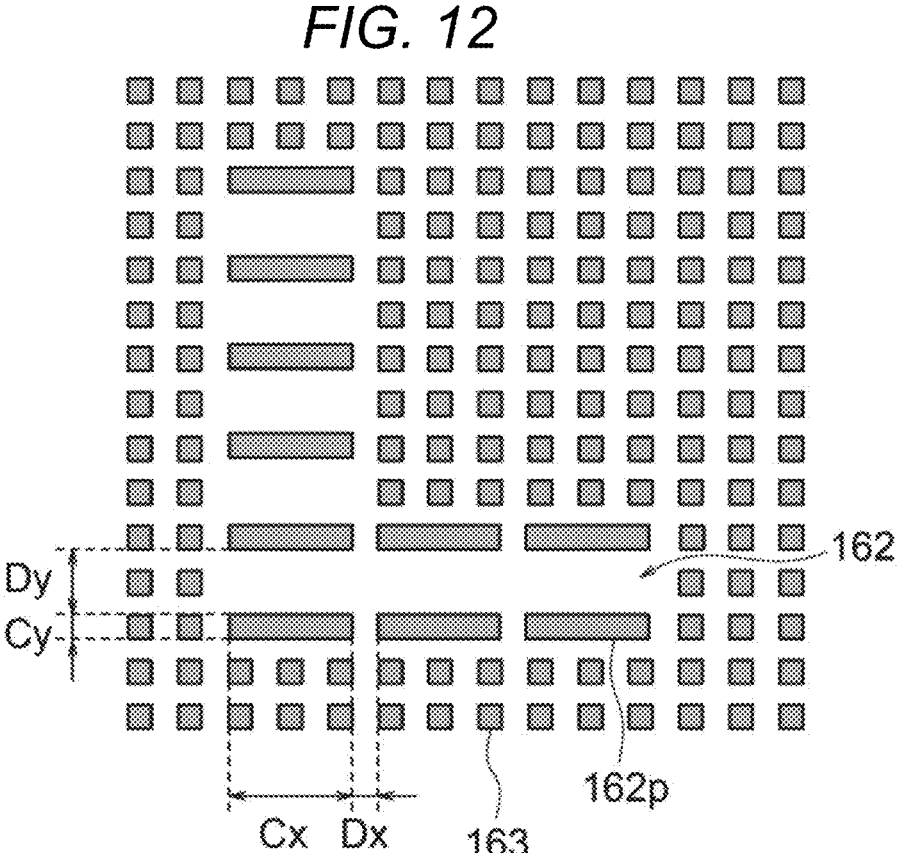
FIG. 12 is a diagram illustrating an example of a configuration of an alignment mark and dummy pads according to a fifth embodiment.
Figure 12:
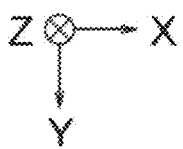

FIG. 12 is a diagram illustrating an example of a configuration of an alignment mark 162 and dummy pads 163 according to a fifth embodiment. In the fifth embodiment, the shape of each alignment pad 162p is different from that in the second embodiment.

The shape of each alignment pad 162p is different from the shape of each dummy pad 163. In the example illustrated in FIG. 12, the shape of each alignment pad 162p is substantially rectangular.

An X-direction size Cx of each alignment pad 162p is, for example, approximately 12.5 μm. A Y-direction size Cy of each alignment pad 162p is, for example, approximately 3 μm. An X-direction pitch Dx between the alignment pads 162p is, for example, approximately 2.5 μm. A Y-direction pitch Dy between the alignment pads 162p is, for example, approximately 7 μm.

A coverage CV2 of the alignment pads 162p (alignment mark 162) in the mark region Rm is represented by Equation 2 using the sizes Cx and Cy and the pitches Dx and Dy. The coverage CV2 is, for example, approximately 25%.

Due to the difference in shape between each alignment pad 162p and each dummy pad 163, the alignment mark 162 can be more easily recognized.

As in the fifth embodiment, the shape of the alignment pads 162p may be changed. The semiconductor device 1 according to the fifth embodiment can obtain the same effect as that of the second embodiment.

The shape change is not limited to the alignment pad 162p, and the shape of the dummy pads 163 may be changed.

Sixth Embodiment

Figure 13:
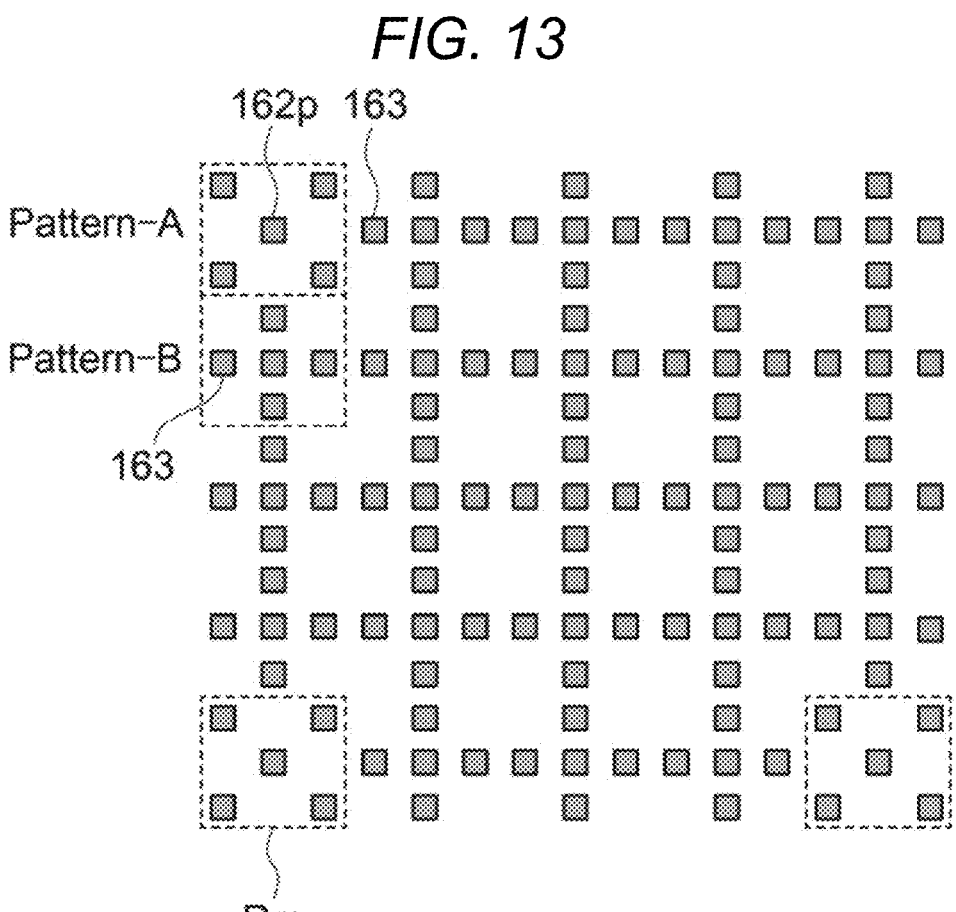
FIG. 13 is a diagram illustrating an example of a configuration of an alignment mark and dummy pads according to a sixth embodiment.
Figure 13:
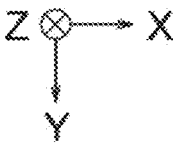

FIG. 13 is a diagram illustrating an example of a configuration of an alignment mark 162 and dummy pads 163 according to a sixth embodiment. In the sixth embodiment, the arrangement of alignment pads 162p and the dummy pads 163 is different from that in the first embodiment.

The alignment pads 162p are arranged according to a pattern A composed of two or more alignment pads 162p. The pattern A is, for example, an X-shaped pattern. A plurality of alignment pads 162p are located for each pattern A in the mark region Rm.

The dummy pads 163 are located according to a pattern B composed of two or more dummy pads 163. The pattern B is, for example, a cross-shaped pattern. A plurality of dummy pads 163 are located for each pattern B in the dummy region Rd.

The coverage of the alignment pads 162p in the pattern A is substantially the same as the coverage of the dummy pads 163 in the pattern B. In the example illustrated in FIG. 13, the size of each alignment pad 162p is substantially the same as the size of each dummy pad 163. The number of alignment pads 162p in the pattern A and the number of dummy pads 163 in the pattern B are the same five pads. Accordingly, since the pattern A and the pattern B have substantially the same area, the coverage is also substantially the same.

In the example illustrated in FIG. 13, the pattern A is located in three locations. Due to the boundary between the pattern A and the pattern B, the boundary of the alignment mark 162 can be recognized. That is, the alignment mark 162 can be recognized due to the difference in the arrangement of the patterns (array).

In the sixth embodiment, since the size of the alignment pad 162p is substantially the same as the size of the dummy pad 163, polishing by CMP can be made more uniform.

The number of patterns illustrated in FIG. 13 is one for each of the alignment pads 162p of the pattern A and the dummy pads 163 of the pattern B. However, for example, one of the alignment pads 162p and the dummy pads 163 may be located in a combination of a plurality of patterns.

As in the sixth embodiment, the arrangement of the alignment pads 162p and the dummy pads 163 may be changed. The semiconductor device 1 according to the sixth embodiment can obtain the same effect as that of the first embodiment.

Modification of Sixth Embodiment

Figure 14:
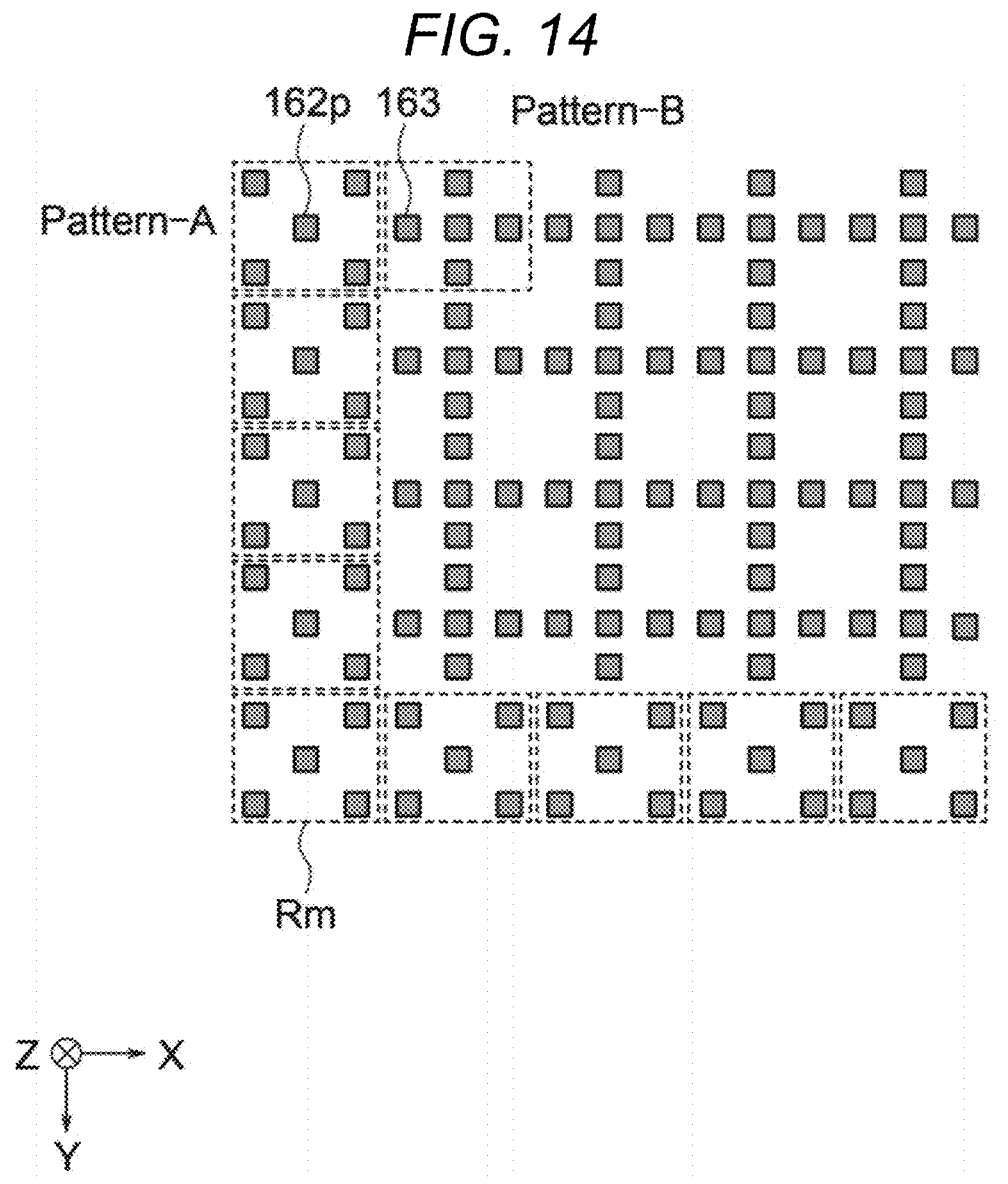

FIG. 14 is a diagram illustrating an example of a configuration of an alignment mark 162 and dummy pads 163 according to a modification of the sixth embodiment. In the modification of the sixth embodiment, the arrangement of patterns A and B is different from that in the sixth embodiment.

In the example illustrated in FIG. 14, an L-shaped alignment mark 162 is formed by arranging a plurality of patterns A side by side sequentially.

As in the modification of the sixth embodiment, the arrangement of the patterns A and B may be changed. The semiconductor device 1 according to the modification of the sixth embodiment can obtain the same effect as that of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first chip; and
a second chip bonded to the first chip, wherein
the first chip includes:
   a first alignment mark disposed in a first region of a bonding surface, and
   a plurality of first dummy pads disposed in a second region of the bonding surface different from the first region,
the second chip includes:
   a second alignment mark disposed on the bonding surface corresponding to the first alignment mark, and
   a plurality of second dummy pads disposed in a region of the bonding surface different from the second alignment mark, and
wherein a coverage of the first alignment mark in the first region is substantially the same as a coverage of the first dummy pads in the second region.

2. The semiconductor device according to claim 1, wherein the first alignment mark includes a plurality of alignment pads, and the plurality of alignment pads in the first region has a contrast different from that of the plurality of first dummy pads in the second region.

3. The semiconductor device according to claim 1, wherein the first alignment mark includes a plurality of alignment pads, and one of the alignment pads and the first dummy pads is larger in size and larger in pitch than another.

4. The semiconductor device according to claim 3, wherein a size of the alignment pad is smaller than a size of the first dummy pad, and a pitch between the alignment pads is smaller than a pitch between the first dummy pads.

5. The semiconductor device according to claim 3, wherein a size of the alignment pad is larger than a size of the first dummy pad, and a pitch between the alignment pads is larger than a pitch between the first dummy pads.

6. The semiconductor device according to claim 5, wherein the first dummy pads are further disposed between the alignment pads.

7. The semiconductor device according to claim 1, wherein the first alignment mark includes a plurality of alignment pads, and at least one of the alignment pads and the first dummy pads are located in a triangular lattice shape.

8. The semiconductor device according to claim 1, wherein the first alignment mark includes a plurality of alignment pads, and a shape of the alignment pads is different from the shape of the first dummy pad.

9. The semiconductor device according to claim 1, wherein the first alignment mark includes a plurality of alignment pads, the plurality of alignment pads are arranged in the first region for each first pattern composed of two or more of the alignment pads, the plurality of first dummy pads are located in the second region for each second pattern composed of two or more of the first dummy pads, and a coverage of the alignment pads in the first pattern is substantially the same as the coverage of the first dummy pads in the second pattern.

10. The semiconductor device according to claim 9, wherein the plurality of first patterns are located side by side sequentially.

11. The semiconductor device according to claim 1, wherein for each position where a predetermined range is moved by a predetermined fraction of one side of the predetermined range, a coverage of the first alignment mark and the first dummy pads with respect to the predetermined range is in a range of 25±20%, and the predetermined range has a size that is a product of a predetermined number and a maximum long side of the first dummy pads.

12. The semiconductor device according to claim 1, wherein the first alignment mark is asymmetric with respect to an axis parallel to the bonding surface.

13. The semiconductor device according to claim 1, wherein the first chip includes:

a first semiconductor element, and a first columnar electrode electrically connected to the first semiconductor element and penetrating through the first chip, the second chip includes:

a second semiconductor element, and a second columnar electrode electrically connected to the second semiconductor element and penetrating through the second chip, and the first columnar electrode is electrically connected to the second columnar electrode.

14. A method of manufacturing a semiconductor device, the method comprising:

forming a first alignment mark in a first region and a plurality of first dummy pads in a second region different from the first region on a first surface of a first chip;

forming a second alignment mark corresponding to the first alignment mark and a plurality of second dummy pads in a region different from the second alignment mark on a second surface of a second chip;

bonding the first surface of the first chip and the second surface of the second chip together based on the first alignment mark and the second alignment mark; and forming the first alignment mark and the plurality of first dummy pads such that a coverage of the first alignment mark in the first region is substantially the same as a coverage of the first dummy pads in the second region.

15. A method of disposing an alignment mark, the method comprising:

forming a first recess portion in a first region of an insulating film of a first chip and forming a second recess portion in a second region of the insulating film;

forming a conductor on the insulating film and inside the first recess portion and the second recess portion; and forming a plurality of first dummy pads in the first region and a first alignment mark in the second region by polishing the conductor until the insulating film is exposed; and forming the first recess portion and the second recess portion such that a coverage of the first alignment mark in the first region is substantially the same as a coverage of the first dummy pads in the second region.

16. The semiconductor device according to claim 1, wherein the first alignment mark has a substantially L shape.

17. The semiconductor device according to claim 1, wherein the plurality of first dummy pads are formed of metal.

18. The semiconductor device according to claim 1, wherein each of the plurality of first dummy pads has a substantially square shape.

19. The semiconductor device according to claim 1, wherein the plurality of first dummy pads are arranged in a lattice.

20. The semiconductor device according to claim 2, wherein each of the plurality of alignment pads has a substantially square shape.

* * * * *